US006914549B2

United States Patent
Chen et al.

(10) Patent No.: US 6,914,549 B2
(45) Date of Patent: Jul. 5, 2005

(54) RECONFIGURABLE ANALOG-TO-DIGITAL CONVERTER

(75) Inventors: Feng Chen, Plano, TX (US); Ranjit Gharpurey, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/661,861

(22) Filed: Sep. 12, 2003

(65) Prior Publication Data

US 2005/0057384 A1 Mar. 17, 2005

(51) Int. Cl.[7] .................................................. H03M 1/12
(52) U.S. Cl. ........................................ 341/155; 341/143
(58) Field of Search ................................. 341/118, 120, 341/122, 143, 155, 161

(56) References Cited

U.S. PATENT DOCUMENTS

| | | | |
|---|---|---|---|
| 5,499,027 A | 3/1996 | Karanicolas et al. | 341/120 |
| 5,696,511 A | 12/1997 | Matsumoto et al. | 341/161 |
| 5,877,720 A * | 3/1999 | Setty et al. | 341/159 |
| 6,028,546 A | 2/2000 | Signell et al. | 341/161 |
| 6,166,675 A | 12/2000 | Bright | 341/162 |
| 6,222,478 B1 | 4/2001 | Bright | 341/162 |
| 6,243,034 B1 * | 6/2001 | Regier | 341/166 |
| 6,271,782 B1 * | 8/2001 | Steensgaard-Madsen | 341/143 |
| 6,348,888 B1 * | 2/2002 | Yu | 341/161 |
| 6,369,744 B1 | 4/2002 | Chuang | 341/161 |
| 6,396,429 B2 * | 5/2002 | Singer et al. | 341/155 |
| 6,600,440 B1 | 7/2003 | Sakurai | 341/172 |
| 6,617,992 B2 | 9/2003 | Sakurai | 341/161 |
| 6,686,860 B2 * | 2/2004 | Gulati et al. | 341/155 |
| 6,690,310 B1 * | 2/2004 | Upton | 341/118 |
| 6,696,998 B2 * | 2/2004 | Ying et al. | 341/143 |
| 6,753,801 B2 * | 6/2004 | Rossi | 341/161 |
| 6,816,103 B2 * | 11/2004 | Jonsson et al. | 341/160 |

* cited by examiner

*Primary Examiner*—Michael Tokar
*Assistant Examiner*—Linh V Nguyen
(74) *Attorney, Agent, or Firm*—Wade James Brady, III; Frederick J. Telecky, Jr.

(57) ABSTRACT

Configuring an analog-to-digital converter includes receiving a control signal and an input analog signal at an analog-to-digital converter, where the control signal has either a first state or a second state. The first state is associated with a first configuration and the second state is associated with a second configuration. If the control signal has the first state, the analog-to-digital-converter is configured in the first configuration and a digital signal comprising a first digital signal is generated according to a pipeline conversion. If the control signal has the second state the analog-to-digital converter is configured in the second configuration and the digital signal comprising a second digital signal is generated according to a multi-stage sigma delta modulation conversion. The digital signal is processed to yield a digital output.

14 Claims, 3 Drawing Sheets

RECONFIGURABLE ANALOG-TO-DIGITAL CONVERTER

TECHNICAL FIELD OF THE INVENTION

This invention relates generally to the field of signal processing and more specifically to a reconfigurable analog-to-digital converter.

BACKGROUND OF THE INVENTION

Analog-to-digital converters (ADCs) are generally configured to operate at specific bandwidth ranges with particular sampling frequency ranges. For example, a pipeline ADC typically operates at a Nyquist frequency, while a sigma-delta modulator may operate at an oversampling frequency range. In some circuit designs, it may be necessary to have an analog-to-digital converter operating at different resolutions. Known techniques for having an ADC operating at different resolutions involve including various ADCs in the design according to the desired resolution. These known techniques, however, may result in a more costly design in some situations.

SUMMARY OF THE INVENTION

In accordance with the present invention, disadvantages and problems associated with previous techniques for processing data packets using markers may be reduced or eliminated.

According to one embodiment, configuring an analog-to-digital converter includes receiving a control signal and an input analog signal at an analog-to-digital converter, where the control signal has either a first state or a second state. The first state is associated with a first configuration and the second state is associated with a second configuration. If the control signal has the first state, the analog-to-digital-converter is configured in the first configuration and a digital signal comprising a first digital signal is generated according to a pipeline conversion. If the control signal has the second state the analog-to-digital converter is configured in the second configuration and the digital signal comprising a second digital signal is generated according to a multi-stage sigma delta modulation conversion. The digital signal is processed to yield a digital output.

Certain embodiments of the invention may provide one or more technical advantages. A technical advantage of one embodiment may be the simplified hardware of a circuit that requires the use of various types of ADC resolution. Another technical advantage of one embodiment may be that by reconfiguring an ADC using a control signal, the reconfiguration may be more efficient.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
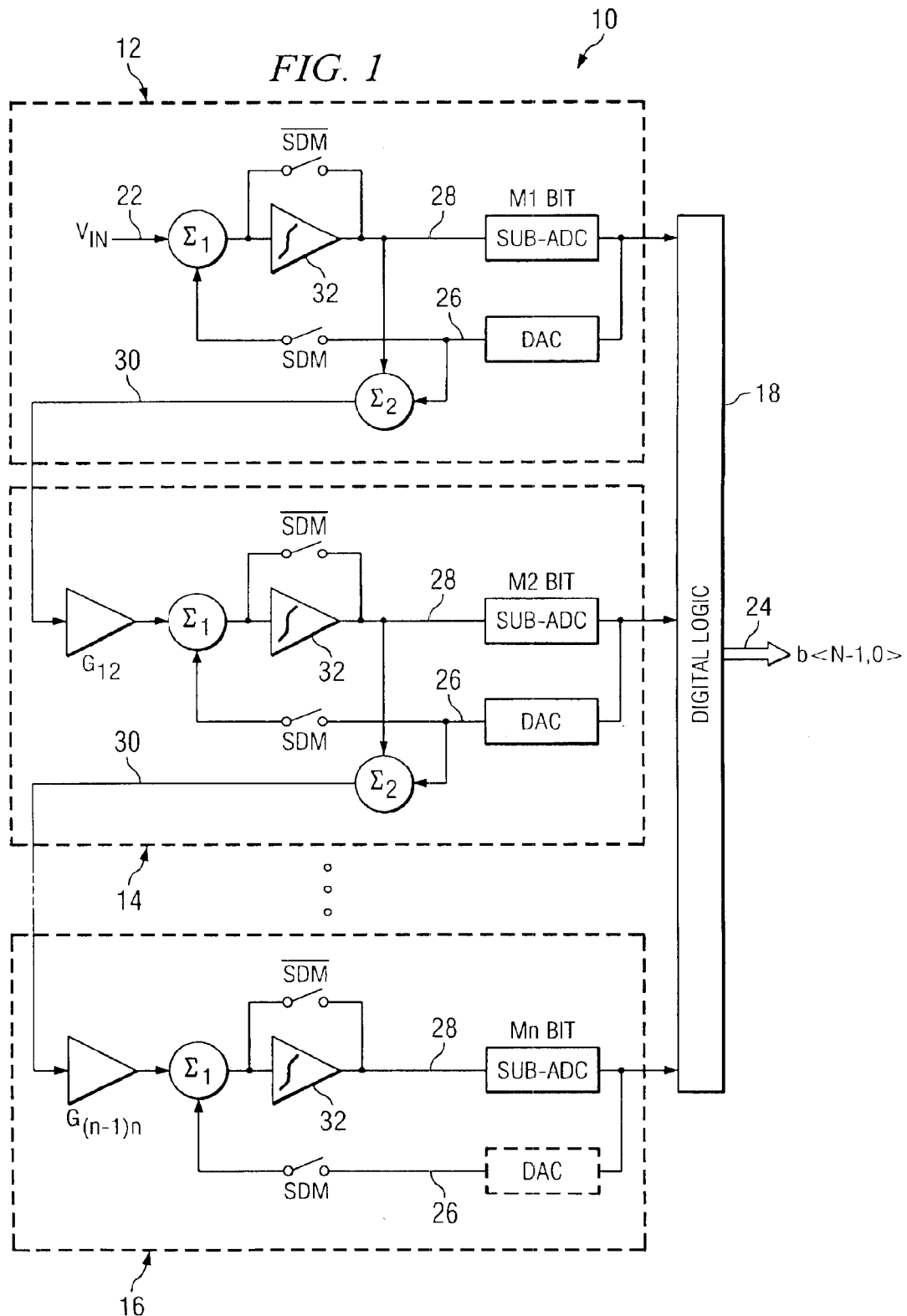
FIG. 1 is a block diagram of one embodiment of a reconfigurable analog-to-digital converter that may be used in accordance with the present invention.
Figure 2:
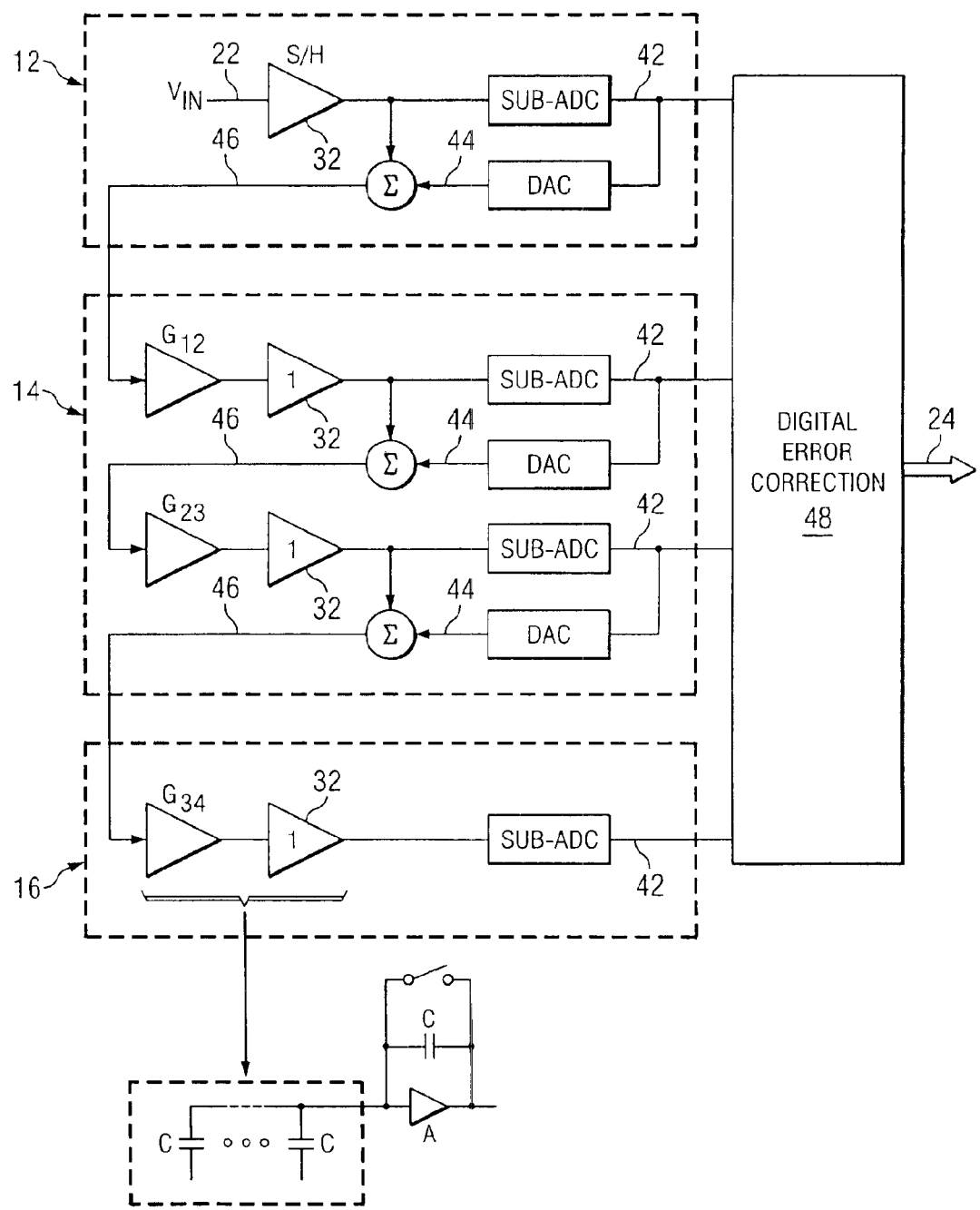
FIG. 2 is a block diagram of one embodiment of a pipeline configuration that may be used with the reconfigurable analog-to-digital converter of FIG. 1.
Figure 3:
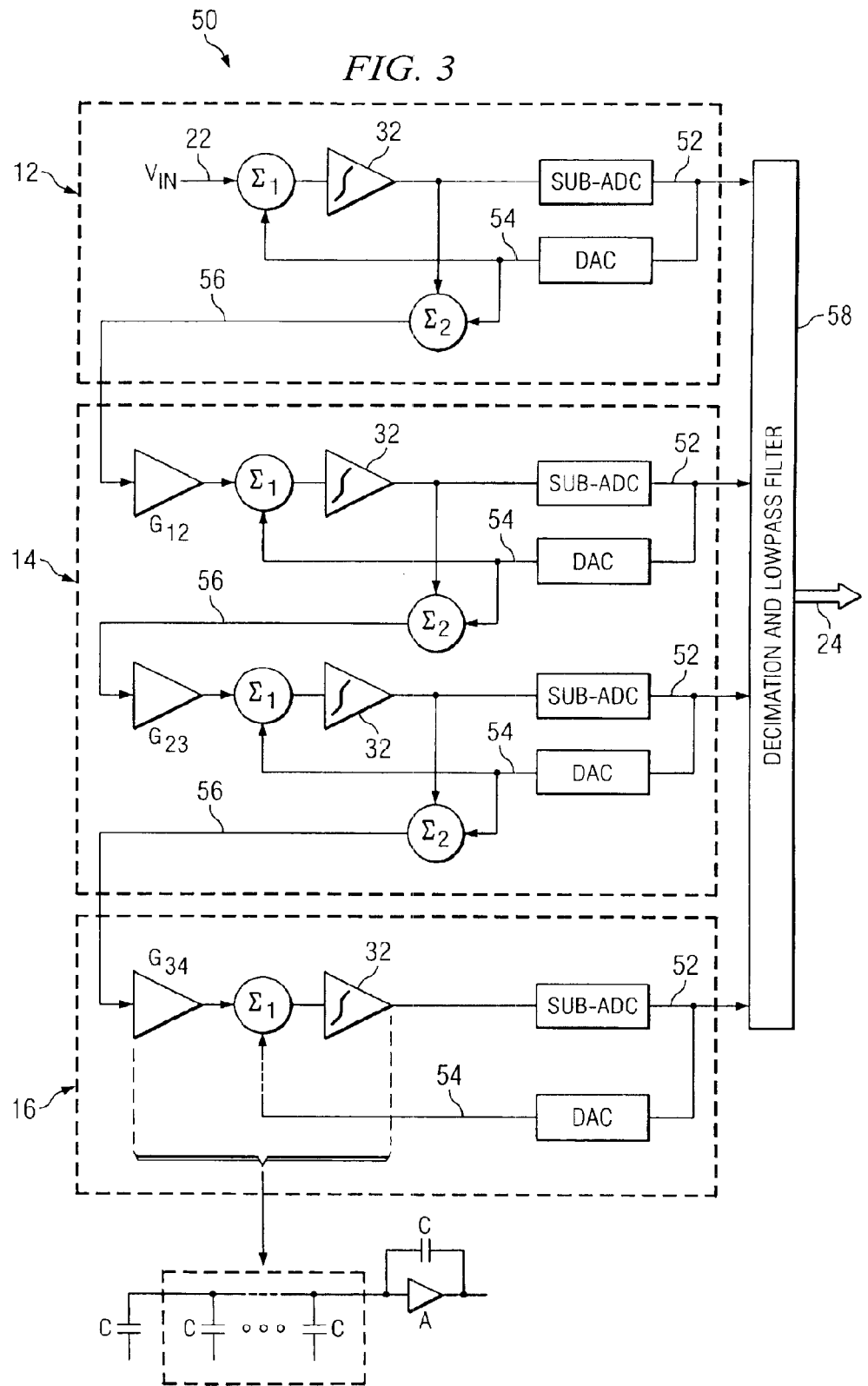
FIG. 3 is a block diagram of one embodiment of a multi-stage noise shaping configuration that may be used with the reconfigurable analog-to-digital converter of FIG. 1.

Embodiments of the present invention and its advantages are best understood by referring to FIGS. 1 through 3 of the drawings, like numerals being used for like and corresponding parts of the various drawings.

FIG. 1 is a block diagram of one embodiment of a reconfigurable analog-to-digital converter (ADC) 10 that may be used in accordance with the present invention. In general, reconfigurable ADC 10 may be reconfigured according to a control signal. The control signal may operate to switch the configuration of reconfigurable ADC 10 from a pipeline ADC to a multistage sigma delta (MASH) ADC and vice versa. According to the illustrated embodiment, reconfigurable ADC 10 includes a first stage 12, a middle stage 14, a final stage 16, and a digital logic block 18 coupled as shown in FIG. 1.

Stages 12, 14, and 16 each includes an integrator, at least one summing node $\Sigma_1$ and $\Sigma_2$, a multi-bit quantizer (sub-ADC), and a feedback digital to analog converter (DAC). Each stage 12, 14, and 16 is coupled to each other using an interstage gain G so that the coarse output of a previous stage may be fed to a subsequent stage. Reconfigurable ADC 10 may include any number of middle stages 14 without departing from the scope of the invention.

According to the illustrated embodiment, first stage 12 includes a switched integrator 32 that is controlled by a control signal SDM. Depending on the status of the control signal, integrator 32 of first stage 12 may operate as a sample/hold circuit or as an integrator. For example, if control signal SDM is low, the integrator feedback of first stage 12 is closed thereby configuring switched integrator 32 into a sample/hold circuit, which may be used in a pipeline ADC configuration as will be more particularly described with reference to FIG. 2. If control signal SDM is high, the integrator feedback of first stage 12 is open thereby configuring switched integrator 32 as an integrator, which may be used in a MASH configuration as will be more particularly described with reference to FIG. 3.

Stages 12, 14, and 16 each includes a multi-bit quantizer, or sub-ADC, and a feedback DAC. The sub-ADC outputs a coarse digital signal for the corresponding stage, and the feedback DAC converts the coarse digital signal into a coarse analog signal. According to the illustrated embodiment, the sub-ADCs quantize the integrated signal to generate coarse digital signals for each stage. The coarse digital signals may then be used to generate a digital output 24 comprising the information embedded in input analog signal 22.

The feedback DAC of each of the stages 12, 14, and 16 also receive control signal SDM that reconfigures the feedback circuit. According to the illustrated embodiment, if control signal SDM is high, the feedback loop of the feedback DAC is actualized. If control signal SDM is low, the feedback loop of the feedback DAC is left open. At the feedback loop of the feedback DAC of first stage 12 and second stage 14, coarse analog signal 26 of the corresponding stage is summed with the integrated/sampled signal 28 of that stage to prepare the signal for feeding to the subsequent stage. At final stage 16, the feedback DAC may be omitted according to control signal SDM. For example, if control signal SDM is low, the feedback DAC may be omitted. If control signal SDM is high, the feedback DAC operates to generate coarse analog signal 26 for summing with the amplified residual signal of the previous stage, in this case, middle stage 14.

Interstage gain block G is used to amplify and buffer a residual signal 30 for the next stage. According to the illustrated embodiment, residual signal 30 comprises the sum of coarse analog signal 26 and integrated/sampled signal 28. Interstage gain block G may amplify residual signal 30 according to a gain described by Equation (1):

$$G_{(n-1)n} \leq 2^{mn-1} \qquad (1)$$

where n represents the number of stages and m represents the number of bits generated per stage. Any other suitable gain may be applied to residual signal 30 without departing from the scope of the invention.

Digital logic 18 receives the coarse digital signals of stages 12, 14, and 16 to generate a digital output 24. According to the illustrated embodiment, digital logic may perform decimation, error correction, filtering, or any other suitable processing of a digital signal in order to generate a digital output. For example, in the embodiment where control signal SDM is low, digital logic 18 may perform digital error correction of the coarse digital signals to generate the digital output.

According to the illustrated embodiment, digital logic 18 generates the digital output in binary words b<N−1,0>, where N describes the total number of bits obtained as described by Equation (2):

$$N \approx \sum_{i=1}^{n}(mi-1) \qquad (2)$$

Depending on whether control signal SDM is high or low, the configuration of reconfigurable ADC 10 may toggle between a pipeline ADC or a MASH-like sigma-delta modulator. As will be described with reference to FIGS. 2 and 3, if control signal SDM is low, the configuration is that of a pipeline ADC, and if control signal SDM is high, the configuration is that of a MASH-like sigma-delta modulator. Accordingly, reconfigurable ADC 10 may operate at either a Nyquist frequency rate or an oversampling frequency rate depending on the configuration.

Modifications, additions, or omissions may be made to reconfigurable ADC 10 without departing from the scope of the invention. For example, additional middle stages 14 may be added to accommodate any suitable number of bits at digital output 24. As another example, reconfigurable ADC 10 may be expanded to include any suitable number of stages without departing from the scope of the invention. Additionally, functions may be performed using any suitable logic comprising software, hardware, other logic, or any suitable combination of the preceding. "Each" as used in this document refers to each member of a set or each member of a subset of a set.

A block diagram of one embodiment of a pipeline configuration that may be used with the reconfigurable analog-to-digital converter of FIG. 1 is described with reference to FIG. 2. A block diagram of one embodiment of a multi-stage noise shaping (MASH) ADC that may be used with the reconfigurable analog-to-digital converter of FIG. 1 is described with reference to FIG. 3.

FIG. 2 illustrates a block diagram of a pipeline ADC 40 that may result in response to a low control signal SDM received at the reconfigurable ADC 10 of FIG. 1. According to one embodiment, pipeline ADC 40 comprises stages 12, 14, and 16 as described with reference to FIG. 1. In the illustrated embodiment, middle stage 14 may include any number of sub-stages to accommodate any suitable number of bits at digital output 24 as was previously described. Pipeline ADC 40 may be used when the resolution required at a circuit may call for a moderate frequency rate, such as a Nyquist rate, and a high bandwidth.

In this embodiment, the integrator of first stage 12 is configured as a sample/hold circuit, while the integrators of subsequent stages 14 and 16 are configured as buffers. According to the illustrated embodiment, the buffers at the subsequent stages are gainless buffers.

At each stage, an analog input is either sampled and held or buffered and then transmitted to a sub-ADC module that converts the sampled/buffered signal into a coarse digital signal 42. According to one embodiment, a multi-bit ADC may be used to quantize the sampled/buffered signal and generate coarse digital signal 42. Any suitable technique for converting the sampled/buffered signal into coarse digital signal 42 may be used without departing from the scope of the invention. A DAC at each stage converts coarse digital signal 42 into coarse analog 44 signal that may be fed into a summing node. According to the illustrated embodiment, a DAC is not used at final stage 16 according to control signal SDM as was described with reference to FIG. 1.

At the end of each stage, a summing node Σ may generate a residual signal 46 by summing the sampled/buffered signal and coarse analog signal 44. Residual signal 46 may be described as the residual error of the stage, which may be amplified at the beginning of the subsequent stage to return the amplitude of the signal to a full-scale amplitude. As was described with reference to FIG. 1, an internode gain block G at the beginning the stage amplifies the residual signal.

Digital error correction block 48 receives the course digital signal 42 from each stage to generate digital output 24. According to the illustrated embodiment, coarse digital signal 42 from stages 12, 14, and 16 are fed to digital error correction block 48 to perform error correction of the coarse digital signals 42 and generate digital output 24. Any suitable number of stages may be used to generate any suitable number of bits of coarse digital signal 42 without departing from the scope of the invention.

Modifications, additions, or omissions may be made to reconfigurable ADC 10 without departing from the scope of the invention. For example, although a four-stage reconfigurable ADC has been used to describe the configuration of pipeline ADC 40, additional stages may be added to middle stage 14 to accommodate any suitable number of bits at digital output 24. Additionally, functions may be performed using any suitable logic comprising software, hardware, other logic, or any suitable combination of the preceding.

FIG. 3 illustrates a block diagram of a MASH-like sigma-delta modulator with interstage gain that may result in response to a high control signal SDM received at the reconfigurable ADC 10 of FIG. 1. According to one embodiment, MASH-like sigma-delta modulator 50 comprises stages 12, 14, and 16 as described with reference to FIG. 1. In the illustrated embodiment, middle stage 14 may include any number of sub-stages to accommodate a suitable number of bits at digital output 24 as was previously described. MASH-like sigma-delta modulator 50 may be used when the resolution required at a circuit may call for a high frequency rate, such as an oversampling rate, and a narrow bandwidth.

In this embodiment, each stage comprises a sigma-delta modulator such as a first order sigma-delta modulator. Higher order sigma-delta modulators may be used without departing from the scope of the invention. Additionally, at the beginning of each stage an interstage gain block G is included to amplify a residual analog signal 56 of the previous stage.

In operation, MASH-like sigma-delta modulator 50 receives input analog signal 22, and summation nodes $\Sigma_1$, integrators 32, and sub-stage ADCs (sub-ADCs) generate a coarse digital signal 52. According to one embodiment, coarse digital signal 52 may comprise a multi-bit digital signal. Coarse digital signal 52 may, however, comprise a one-bit digital signal. A feedback DAC circuit converts coarse digital signal 52 into a coarse analog signal 54. Summation node $\Sigma_2$ sums the coarse digital signal 52 and an integrated signal to generate residual analog signal 56 for the stage.

A decimation and low-pass filter block 58 receives the coarse digital signals 52 and converts them to a digital output 24. According to the illustrated embodiment, decimation and low-pass filter block 58 decimates and filters the coarse digital signals 52 to generate digital output 24 comprising the information embedded in analog input signal 22. Decimation and low-pass filter block 58 may perform other signal processing of coarse digital signals 52 suitable for generating digital output 24. For example, decimation and low-pass filter block 58 may also perform error correction.

Modifications, additions, or omissions may be made to reconfigurable ADC 10 without departing from the scope of the invention. For example, although a four-stage reconfigurable ADC has been used to describe the configuration of MASH-like sigma-delta modulator 50, an number of stages may be used at middle stage 14 to accommodate any suitable number of bits at digital output 24. Additionally, functions may be performed using any suitable logic comprising software, hardware, other logic, or any suitable combination of the preceding.

Certain embodiments of the invention may provide one or more technical advantages. A technical advantage of one embodiment may be the simplified hardware of a circuit that requires the use of various types of ADC resolution. Another technical advantage of one embodiment may be that by reconfiguring an ADC using a control signal, the reconfiguration may be more efficient.

Although an embodiment of the invention and its advantages are described in detail, a person skilled in the art could make various alterations, additions, and omissions without departing from the spirit and scope of the present invention as defined by the appended claims.

What is claimed is:

1. A method for reconfiguring an analog-to-digital converter, comprising the steps of:
   providing an analog-to-digital converter having a plurality of serially connected stages and an input terminal, each stage including a switchable integrator capable of operation as one of a sample/hold circuit and as an integrator;
   receiving at said analog-to-digital converter a control signal and, at said input terminal, an input analog signal, the control signal having a state selected from a group consisting of a first state and a second state, the first state associated with a first configuration of said stages by causing said switchable integrator to operate as a sample/hold circuit, the second state associated with a second configuration of said stages by causing said switchable integrator to operate as an integrator, the input analog signal comprising information;
   performing the following if the control signal has the first state;
      configuring the analog-to-digital-converter in the first configuration in response to the control signal; and
      generating a digital signal comprising a first digital signal according to a pipeline conversion;
   performing the following if the control signal has the second state:
      configuring the analog-to-digital converter in the second configuration in response to the control signal; and
      generating the digital signal comprising a second digital signal according to a multi-stage sigma delta modulation conversion; and
   processing the digital signal to yield a digital output, the digital output comprising the information.

2. The method of claim 1, wherein the first configuration comprises a pipeline analog-to-digital converter configuration.

3. The method of claim 1, wherein the second configuration comprises a multi-stage noise shaping analog-to-digital converter configuration.

4. The method of claim 1, wherein processing the digital signal to yield the digital output further comprises:
   decoding the digital signal by performing error correction of the digital signal; and
   generating a binary code corresponding to the decoded digital signal, the binary code comprising the information.

5. The method of claim 1, wherein processing the digital signal to generate a digital output further comprises:
   decimating the digital signal to yield an averaged digital signal, the averaged digital signal having a higher resolution than the digital signal; and
   filtering the averaged digital signal to yield the digital output.

6. The method of claim 1, wherein the first state associated with the first configuration comprises a low state of the control signal.

7. The method of claim 1, wherein the second state associated with the second configuration comprises a high stage of the control signal.

8. A method for reconfiguring an analog-to-digital converter, comprising the steps of:
   providing an analog-to-digital converter having a plurality of serially connected stages and an input terminal, each stage including a switchable integrator capable of operation as one of a sample/hold circuit and as an integrator;
   receiving at said analog-to-distal converter a control signal and, at said input terminal, an input analog signal, the control sigal having a state selected from a group consisting of a first state and a second state, the first state associated with a first configuration of said stages, the second state associated with a second configuration of said stages, the input analog signal comprising information;
   performing the following if the control signal has the first state:
      configuring the analog-to-digital-converter in the first configuration in response to the control signal, and
      generating a digital signal comprising a first digital signal according to a pipeline conversion;
   performing the following if the control signal has the second state:
      configuring the analog-to-digital converter in the second configuration in response to the control signal; and
      generating the digital signal comprising a second digital signal according to a multi-stage sigma delta modulation conversion; and processing the digital signal to yield a digital output, the digital output comprising the information;
   wherein generating the first digital signal comprises:
      repeating the following for each stage of a plurality of stages:
         convert a residual analog signal of a previous stage to a coarse digital signal;
         convert the coarse digital signal to a coarse analog signal; and
         sum the analog signal and the coarse digital signal to yield a residual analog signal of a current stage; and
      generating a first digital signal according to the coarse digital signals of the plurality of stages.

9. A method for reconfiguring an analog-to-digital converter, comprising the steps of:
provrding an analog-to-digital converter having a plurality of serially connected stages and an input terminal, each stage including a switchable integrator capable of operation as one of a sample/hold circuit and as an integrator;
receiving at said analog-to-digital converter a control signal and, at said input terminal, an input analog signal, the control signal having a state selected from a group consisting of a first state and a second state, the first state associated with a first configuration of said stages, the second state associated with a second configuration of said stages, the input analog signal comprising information;
performng the following if the control signal has the first state:
configuring the analog-to-digital-converter in the first configuration in response to the control signal; and
generating a distal signal comprising a first digital signal according to a pipeline conversion;
performing the following if the control signal has the second state:
configuring the analog-to-digital converter in the second configuration in response to the control signal; and
generating the digital signal comprising a second digital signal according to a multi-stage sigma delta modulation conversion; and
processing the digital signal to yield a digital output, the distal output comprising the information;
wherein generating the second digital signal comprises:
repeating the following for each stage of a plurality of stages:
applying a sigma-delta modulation to a previous analog signal to yield a current coarse digital signal;
converting the current coarse digital signal to a current coarse analog signal;
generating a current analog signal from the current coarse analog signal; and
generating the second digital signal according to the coarse digital signals of the plurality of stages.

10. An analog-to-digital converter, comprising:
an input node operable to receive a control signal and an input analog signal, the control signal having a state selected from a group consisting of a first state and a second state, the first state associated with a first configuration, the second state associated with a second configuration, the input analog signal comprising information;
a multi-stage circuit coupled to the input node and operable to:
perform the following if the control signal has the first state:
configure the analog-to-digital-converter in the first configuration in response to the control signal; and
generate a digital signal comprising a first digital signal according to a pipeline conversion;
perform the following if the control signal has the second state:
configure the analog-to-digital converter in the second configuration in response to the control signal; and
generate the digital signal comprising a second digital signal according to a multi-stage sigma delta modulation conversion; and
a digital logic block coupled to the multi-stage circuit and operable to process the digital signal to yield a digital output, the digital output comprising the information;
wherein the multi-stage circuit is further operable to:
repeat the following for each stage of a plurality of stages:
convert a residual analog signal of a previous stage to a coarse digital signal;
convert the coarse digital signal to a coarse analog signal; and
sum the analog signal and the coarse digital signal to yield a residual analog signal of a current stage; and
generate a first digital signal according to the coarse digital signals of the plurality of stages.

11. An analog-to-digital converter, comprising:
an input node operable to receive a control signal and an input analog signal, the control signal having a state selected from a group consisting of a first state and a second state, the first state associated with a first configuration, the second state associated with a second configuration, the input analog signal comprising information;
a multi-stage circuit coupled to the input node and operable to:
perform the following if the control signal has the first state:
configure the analog-to-digital-converter in the first configuration in response to the control signal; and
generate a digital signal comprising a first digital signal according to a pipeline conversion;
perform the following if the control signal has the second state:
configure the analog-to-digital converter in the second configuration in response to the control signal; and
generate the digital signal comprising a second digital signal according to a multi-stage sigma delta modulation conversion; and
a digital logic block coupled to the multi-stage circuit and operable to process the digital signal to yield a digital output, the digital output comprising the information;
wherein the multi-stage circuit is further operable to:
repeat the following for each stage of a plurality of stages:
apply a sigma-delta modulation to a previous analog signal to yield a current coarse digital signal;
convert the current coarse digital signal to a current coarse analog signal; and
generate a current analog signal from the current coarse analog signal; and
generate the second digital signal according to the coarse digital signals of the plurality of stages.

12. An analog-to-digital converter, comprising:
an input node operable to receive a control signal and an input analog signal, the control signal having a state selected from a group consisting of a first state and a second state, the first state associated with a first configuration, the second state associated with a second configuration, the input analog signal comprising information;
a multi-stage circuit coupled to the input node and operable to:
perform the following if the control signal has the first state:
configure the analog-to-digital-converter in the first configuration in response to the control signal; and
generate a digital signal comprising a first digital signal according to a pipeline conversion;

perform the following if the control signal has the second state:
configure the analog-to-digital converter in the second configuration in response to the control signal; and
generate the digital signal comprising a second digital signal according to a multi-stage sigma delta modulation conversion; and
a digital logic block coupled to the multi-stage circuit and operable to process the digital signal to yield a digital output, the digital output comprising the information;
the digital logic block further operable to:
decode the digital signal by performing error correction of the digital signal; and
generate a binary code corresponding to the decoded digital signal, the binary code comprising the information;
the digital logic block further operable to:
decimate the digital signal to yield an averaged digital signal, the averaged digital signal having a higher resolution than the digital signal; and
filter the averaged digital signal to yield the digital output.

13. An analog-to-digital converter, comprising:
an analog-to-digital converter having a plurality of serially connected stages and input terminal, each stage including a switchable integrator capable of operation as one of a sample/hold circuit and as an integrator;
means for receiving at said digital-to-analog converter a control signal and, at said input terminal, an input analog signal, the control signal having a state selected from a group consisting of a first state and a second state, the first state associated with a first configuration of said stages by causing said switchable integrator to operate as a sample/hold circuit, the second state associated with a second configuration of said stages by causing said switchable integrator to operate as an integrator, the input analog signal comprising information;
means for performing the following if the control signal has the first state:
configuring the analog-to-digital-converter in the first configuration in response to the control signal; and
generating a digital signal comprising a first digital signal according to a pipeline conversion;
performing the following if the control signal has the second state:
configuring the analog-to-digital converter in the second configuration in response to the control signal; and
generating the digital signal comprising a second digital signal according to a multi-stage sigma delta modulation conversion; and
means for processing the digital signal to yield a digital output, the digital output comprising the information.

14. An analog-to-digital converter, comprising:
an input node operable to receive a control signal and an input analog signal, the control signal having a state selected from a group consisting of a first state and a second state, the first state associated with a first configuration and comprising a low state of the control signal, the second state associated with a second configuration and comprising a high state of the control signal, the input analog signal comprising information;
a multi-stage circuit coupled to the input node and operable to:
perform the following if the control signal has the first state:
configure the analog-to-digital-converter in the first configuration in response to the control signal, the first configuration comprising a pipeline analog-to-digital converter configuration; and
generate a digital signal comprising a first digital signal according to a pipeline conversion by:
repeating the following for each stage of a plurality of stages:
converting a residual analog signal of a previous stage to a coarse digital signal;
converting the coarse digital signal to a coarse analog signal; and
summing the analog signal and the coarse digital signal to yield a residual analog signal of a current stage; and
generating the first digital signal according to the coarse digital signals of the plurality of stages;
perform the following if the control signal has the second state:
configure the analog-to-digital converter in the second configuration in response to the control signal, the second configuration comprising a multi-stage noise shaping analog-to-digital converter configuration; and
generate the digital signal comprising a second digital signal according to a multi-stage sigma delta modulation conversion by:
repeating the following for each stage of a plurality of stages:
applying a sigma-delta modulation to a previous analog signal to yield a current coarse digital signal;
converting the current coarse digital signal to a current coarse analog signal;
generating a current analog signal from the current coarse analog signal; and
generating the second digital signal according to the coarse digital signals of the plurality of stages; and
a digital logic block coupled to the multi-stage circuit and operable to process the digital signal to yield a digital output by:
performing the following if the control signal has the first state:
decoding the digital signal by performing error correction of the digital signal; and
generating a binary code corresponding to the decoded digital signal, the binary code comprising the information; and
performing the following if the control signal has the second state:
decimating the digital signal to yield an averaged digital signal, the averaged digital signal having a higher resolution than the digital signal; and
filtering the averaged digital signal to yield the digital output, the digital output comprising the information.

* * * * *